(12) United States Patent
Namiki et al.

(10) Patent No.: US 8,975,654 B2
(45) Date of Patent: Mar. 10, 2015

(54) LIGHT-REFLECTIVE CONDUCTIVE PARTICLE, ANISOTROPIC CONDUCTIVE ADHESIVE, AND LIGHT-EMITTING DEVICE (71) Applicant: Dexerials Corporation, Tokyo (JP)

(72) Inventors: Hidetsugu Namiki, Tochigi (JP); Shiyuki Kanisawa, Tochigi (JP); Hideaki Umakoshi, Tochigi (JP)

(73) Assignee: Dexerials Corporation, Tokyo (JP)

( * ) Notice: Subject to any disclaimer, the term of this patent is extended or adjusted under 35 U.S.C. 154(b) by 0 days.

(21) Appl. No.: 14/222,249

(22) Filed: Mar. 21, 2014

(65) Prior Publication Data
US 2014/0225144 A1 Aug. 14, 2014

Related U.S. Application Data (63) Continuation of application No. 13/575,786, filed as application No. PCT/JP2011/059724 on Apr. 20, 2011, now abandoned.

(51) Int. Cl.
*H01L 33/00* (2010.01)
*H01B 1/02* (2006.01)
(Continued)

(52) U.S. Cl.
CPC *H01B 1/02* (2013.01); *H01L 33/60* (2013.01); *H01L 33/62* (2013.01); *H01L 2224/48091* (2013.01); *H01L 2224/73204* (2013.01); *H01L 2224/73265* (2013.01); *H01B 1/22* (2013.01); *H01L 33/46* (2013.01); *C09J 9/02* (2013.01); *C09J 11/04* (2013.01); *C08K 9/02* (2013.01); *C09J 163/00* (2013.01); *H01L 2224/16225* (2013.01); *H01L 2224/32225* (2013.01); *H01L 2224/48227* (2013.01);
(Continued)

(58) Field of Classification Search
CPC .............. H01L 33/46; H01B 1/02; H01B 1/22
USPC .............................. 257/98, E33.061, E33.072
See application file for complete search history.

(56) References Cited

U.S. PATENT DOCUMENTS

2007/0126356 A1 6/2007 Tanda et al.

FOREIGN PATENT DOCUMENTS

JP A-11-168235 6/1999
JP A-2007-123613 5/2007
(Continued)

OTHER PUBLICATIONS

May 24, 2011 International Search Report issued in International Application No. PCT/JP2011/059724 (with translation).
(Continued)

*Primary Examiner* — David S Blum
(74) *Attorney, Agent, or Firm* — Oliff PLC (57) ABSTRACT

A light-reflective conductive particle for an anisotropic conductive adhesive used for connecting a light-emitting element to a wiring board by anisotropic conductive connection includes a core particle covered with a metal material and a light reflecting layer formed of a light-reflective inorganic particle having a refractive index of 1.52 or greater on the surface of the core particle. Examples of the light-reflective inorganic particles having a refractive index of 1.52 or greater include a titanium oxide particle, a zinc oxide particle, and an aluminum oxide particle. The coverage of the light reflecting layer on the surface of the core particle is 70% or more.

15 Claims, 4 Drawing Sheets (51) Int. Cl.
*H01L 33/60* (2010.01)
*H01L 33/62* (2010.01)
*H01B 1/22* (2006.01)
*C09J 9/02* (2006.01)
*C09J 11/04* (2006.01)
*C09J 163/00* (2006.01)
*C08G 59/42* (2006.01)
*H01L 33/46* (2010.01)
*C08K 9/02* (2006.01)
*H01L 23/00* (2006.01)

(52) U.S. Cl.
CPC ...... *H01L 2224/45144* (2013.01); *C08G 59/42* (2013.01); *H01L 2224/2939* (2013.01); *H01L 2224/29455* (2013.01); *H01L 2224/29447* (2013.01); *H01L 24/16* (2013.01); *H01L 24/29* (2013.01); *H01L 24/32* (2013.01); *H01L 24/83* (2013.01); *H01L 2224/2929* (2013.01); *H01L 2224/29393* (2013.01); *H01L 2224/83851* (2013.01); *H01L 2224/29444* (2013.01); *H01L 2224/16227* (2013.01); *H01L 2224/9211* (2013.01); *H01L 2224/81903* (2013.01); *H01L 2924/07811* (2013.01)
USPC ............... 257/98; 257/E33.061; 257/E33.072

(56) References Cited

FOREIGN PATENT DOCUMENTS

| | | | |
|---|---|---|---|
| JP | A-2007-157940 | 6/2007 | |
| JP | A-2007-258324 | 10/2007 | |
| JP | 2011-057917 | * 9/2009 | ............. C09J 201/00 |
| JP | A-2011-057917 | 3/2011 | |

OTHER PUBLICATIONS

Oct. 31, 2013 International Preliminary Report on Patentability and Written Opinion issued in International Application No. PCT/JP2011/059724.

* cited by examiner

LIGHT-REFLECTIVE CONDUCTIVE PARTICLE, ANISOTROPIC CONDUCTIVE ADHESIVE, AND LIGHT-EMITTING DEVICE

This is a Continuation of application Ser. No. 13/575,786 filed Jul. 27, 2012, which in turn is a PCT National Stage of PCT/JP2011/059724 filed Apr. 20, 2011. The disclosure of the prior applications is hereby incorporated by reference herein in their entirety.

TECHNICAL FIELD

The present invention relates to a light-reflective conductive particle for an anisotropic conductive adhesive used for connecting a light-emitting element to a wiring board by anisotropic conductive connection, an anisotropic conductive adhesive containing the same, and a light-emitting device in which a light-emitting element is mounted on a wiring board using the adhesive.

BACKGROUND ART

Figure 4:
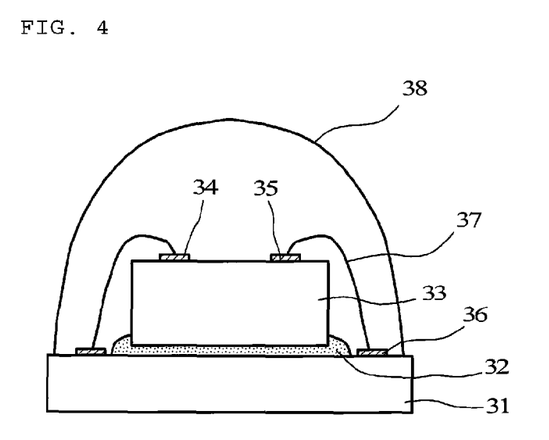
FIG. 4 is a cross-sectional view of a conventional light-emitting device.

A light-emitting device using a light-emitting diode (LED) element has been widely used. An old-type light-emitting device has a structure, as shown in FIG. 4, in which an LED element 33 is bonded to a substrate 31 with a die-bonding adhesive 32, a p electrode 34 and an n electrode 35 on the upper surface of the LED element are wire-bonded to connection terminals 36 on the substrate 31 with gold wires 37, and the entire LED element 33 is sealed with a transparent molding resin 38. However, in the light-emitting device shown in FIG. 4, of light emitted from the LED element 33, the gold wires absorb light having a wavelength of 400 to 500 nm which is emitted toward the upper surface side, and the die-bonding adhesive 32 absorbs part of light which is emitted toward the lower surface side. Therefore, there is a problem in that the light emission efficiency of the LED element 33 is reduced.

Figure 5:
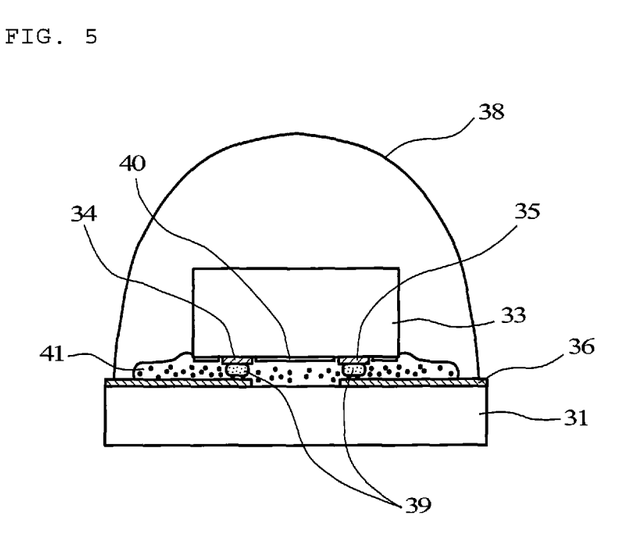
FIG. 5 is a cross-sectional view of a conventional light-emitting device.

In view of the above problems, as shown in FIG. 5, flip-chip mounting of an LED element 33 has been proposed (Patent Literature 1). In this flip-chip mounting technology, bumps 39 are formed on a p electrode 34 and an n electrode 35, respectively, and a light reflecting layer 40 is provided on a bump-formed surface of the LED element 33 so that the p electrode 34 and the n electrode 35 are insulated from each other. The LED element 33 and a substrate 31 are connected and fixed by curing an anisotropic conductive paste 41 or an anisotropic conductive film (not shown). Therefore, in the light-emitting device in FIG. 5, the light emitted upward from the LED element 33 is not absorbed by the gold wires, and almost all light emitted downward is reflected by the light reflecting layer 40 to be emitted upward. Therefore, light emission efficiency (light extraction efficiency) is not reduced.

CITATION LIST

Patent Literature

[Patent Literature 1] Japanese Patent Application Laid-Open No. Hei. 11-168235

SUMMARY OF THE INVENTION

Problem(s) to be Solved by the Invention

However, in the technology of Patent Literature 1, the light reflecting layer 40 needs to be provided on the LED element 33 by a metal vapor deposition method or the like so that the p electrode 34 and the n electrode 35 are insulated, and therefore there is a problem in that an increase in production cost is unavoidable.

On the other hand, when the light reflecting layer 40 is not provided, the surfaces of the conductive particles covered with gold, nickel, or copper in the cured anisotropic conductive paste or anisotropic conductive film assume a brown or dark brown color. Further, an epoxy resin binder itself in which the conductive particles are dispersed also assumes a brown color due to an imidazole-based latent curing agent commonly used to cure the binder. Therefore, it is difficult to improve the light emission efficiency (light extraction efficiency) of light emitted from the light-emitting element. In addition, there is a problem in which the light cannot be reflected while the color of light (emission color) is maintained as the original color.

It is an object of the present invention to solve the above problems of the conventional technology, and to provide a light-reflective conductive particle which does not reduce light emission efficiency and does not cause a hue difference between the emission color of a light-emitting element such as a light-emitting diode (LED) element and the reflected light color even without providing a light reflecting layer on the LED element during production of the light-emitting device by flip-chip mounting the light-emitting element on a wiring board using an anisotropic conductive adhesive, the light reflecting layer increasing the production cost. It is another object to provide an anisotropic conductive adhesive containing the light-reflective conductive particles, and a light-emitting device in which a light-emitting element is flip-chip mounted on a wiring board using the adhesive.

Means for Solving the Problem(s)

The present inventors have assumed that when a light-reflective function is imparted to an anisotropic conductive adhesive itself, the light emission efficiency could be prevented from being reduced. Under the assumption, a light reflecting layer of which color ranges from white to gray and which is composed of specific inorganic particles is provided to the surface of conductive particles to be contained in the anisotropic conductive adhesive so that the coverage thereof is not lower than a predetermined coverage. As a result, the inventors have found that the light emission efficiency of the light-emitting element is not reduced and the hue difference is not caused between the emission color of the light-emitting element and the reflected light color. Accordingly, the present invention has been completed.

The present invention provides a light-reflective conductive particle for an anisotropic conductive adhesive used for connecting a light-emitting element to a wiring board by anisotropic conductive connection, wherein the light-reflective conductive particle includes a core particle covered with a metal material and a light reflecting layer formed of a light-reflective inorganic particle having a refractive index of 1.52 or greater on a surface of the core particle, wherein a coverage of the surface of the core particle covered with the light reflecting layer is 70% or greater.

Further, the present invention provides an anisotropic conductive adhesive used for connecting a light-emitting element to a wiring board by anisotropic conductive connection, which is obtained by dispersing the above-described light-reflective conductive particles in a thermosetting resin composition which provides a cured product having a light transmittance (JIS K7105) of 80% or greater with respect to visible light having a wavelength of 380 to 780 nm with a light path length of 1 cm.

Furthermore, the present invention provides a light-emitting device in which a light-emitting element is mounted on a wiring board with the anisotropic conductive adhesive interposed therebetween in a flip-chip mounting scheme.

Advantageous Effects of the Invention

The light-reflective conductive particle of the present invention for an anisotropic conductive adhesive used for connecting a light-emitting element to a wiring board by anisotropic conductive connection includes a core particle covered with a metal material and a light reflecting layer which is formed of light-reflective inorganic particles having a refractive index of 1.52 or greater on the surface of the core particle and of which color ranges from white to gray. In addition, the coverage of the surface of the core particle covered with the light reflecting layer is 70% or greater. Further, the anisotropic conductive adhesive of the present invention is obtained by dispersing the light-reflective conductive particles in a thermosetting resin composition which provides a cured product having a light transmittance (JIS K7105) of 80% or greater with respect to visible light having a wavelength of 380 to 780 nm with a light path length of 1 cm. Therefore, in a light-emitting device obtained by flip-chip mounting a light-emitting element on a wiring board using the anisotropic conductive adhesive of the present invention, even when the anisotropic conductive adhesive is cured, coloration does not occur. Further, since the contained light-reflective conductive particles have low wavelength dependency of reflection property with respect to visible light, the light emission efficiency is increased, and the emission color of reflected light from the light-emitting element can be maintained as the original color.

EMBODIMENTS FOR CARRYING OUT THE INVENTION

The present invention will be described in detail with reference to the drawings.

Figure 1A:
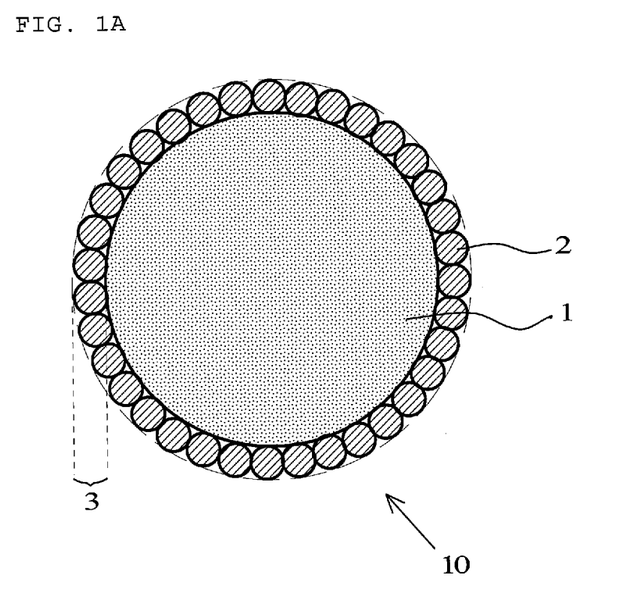
FIG. 1A is a cross-sectional view of a light-reflective conductive particle of the present invention for an anisotropic conductive adhesive.
Figure 1B:
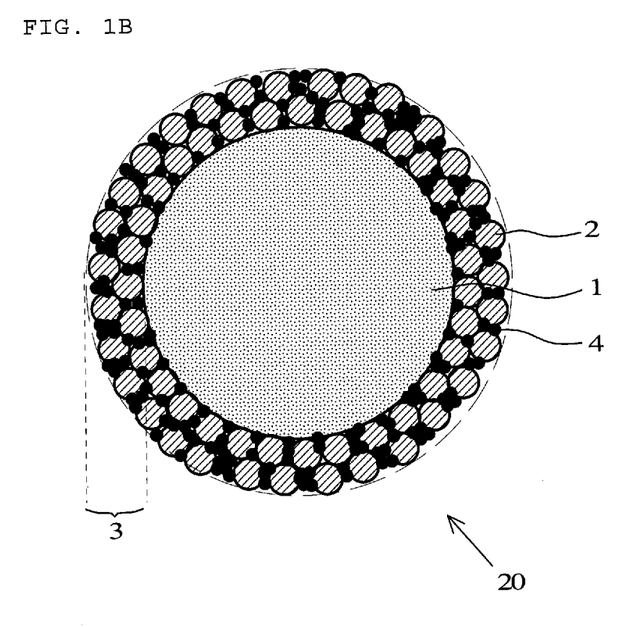
FIG. 1B is a cross-sectional view of a light-reflective conductive particle of the present invention for an anisotropic conductive adhesive.

FIGS. 1A and 1B are cross-sectional views of light-reflective conductive particles 10 and 20, respectively, of the present invention for an anisotropic conductive adhesive. The light-reflective conductive particle of FIG. 1A will be first described.

The light-reflective conductive particle 10 includes a core particle 1 covered with a metal material and a light reflecting layer 3 formed of light-reflective inorganic particles 2 having a refractive index of 1.52 or greater on the surface of the core particle.

The light-reflective inorganic particle 2 having a refractive index of 1.52 or more is an inorganic particle taking on white under sunlight. Therefore, the color of the light reflecting layer 3 formed of these particles ranges from white to gray. This color ranging from white to gray means that the wavelength dependency of reflection property with respect to visible light is low and the visible light is likely to be reflected.

Examples of the preferable light-reflective inorganic particle 2 include at least one type selected from a titanium oxide ($TiO_2$) particle, a zinc oxide (ZnO) particle, and an aluminum oxide ($Al_2O_3$) particle. When photodegradation of a cured product of a cured thermosetting resin composition in the anisotropic conductive adhesive is concerned, among a titanium oxide particle, a zinc oxide particle, and an aluminum oxide particle, a zinc oxide which has no catalytic property against photodegradation and also has a high refractive index can be preferably used.

Since the core particle 1 is subjected to anisotropic conductive connection, the surface of the core particle is made of a metal material. As an aspect of coating the surface with a metal material, an aspect in which the core particle 1 itself is a metal material, or an aspect in which the surface of a resin particle is covered with a metal material is exemplified.

As the metal material, metal materials used for the conventional conductive particle for anisotropic conductive connection can be used. Examples thereof include gold, nickel, copper, silver, solder, palladium, and aluminum particles, particles of alloys thereof, and particles of a layered product thereof (for example, a layered nickel plating/gold flash plating product). Since gold, nickel, and copper among them turn the conductive particle brown, they can provide the effects of the present invention more effectively than other metal materials.

When the core particle 1 is prepared by covering a resin particle with a metal material, a resin particle portion of a resin particle covered with metal, which has been conventionally used as a conductive particle for anisotropic conductive connection, can be used as the resin particle. Examples of such a resin particle include styrene-based resin particles, benzoguanamine resin particles, and nylon resin particles. As a method for covering a resin particle with a metal material, any conventionally known method can be used, and an electroless plating method, an electrolytic plating method, and the like can be used. The thickness of the metal material layer for covering is enough to ensure good connection reliability, and depends on a particle diameter of the resin particle or a kind of metal. It is generally 0.1 to 3 µm, and preferably 0.1 to 1 µm.

If the particle diameter of the core particle 1 having the surface of the metal material is too small, conduction failure tends to occur. If the particle diameter is too large, a short circuit between traces tends to occur. Therefore, the particle diameter is preferably 1 to 20 µm, more preferably 3 to 5 µm, and particularly preferably 3 to 5 µm. In this case, it is preferable that the shape of the core particle 1 be spherical. Further, the shape may be a flake-like shape or a rugby ball shape.

From the viewpoint of dimension relative to the particle diameter of the core particle 1, if the thickness of the light reflecting layer 3 formed of the light-reflective inorganic particles 2 is too small relative to the particle diameter of the core particle 1, the reflectance tends to decrease, and if the thickness is too large, conduction failure tends to occur. Therefore, the thickness of the light reflecting layer is preferably 0.5 to 50%, and more preferably 1 to 25%.

In the light-reflective conductive particle 10, if the particle diameter of the light-reflective inorganic particle 2 constituting the light reflecting layer 3 is too small, light-reflective phenomenon tends not to occur, and if the particle diameter is too large, the formation of a light reflecting layer tends to be difficult.

Therefore, the particle diameter is preferably 0.02 to 4 more preferably 0.1 to 1 µm, and particularly preferably 0.2 to 0.5 µm. In this case, from the viewpoint of wavelength of light to be reflected, it is preferable that the particle diameter of the light-reflective inorganic particle 2 be equal to or greater than 50% of the wavelength of light to be reflected (that is, light emitted from the light-emitting element) so that the light to be reflected does not permeate. Further, examples of the shape of the light-reflective inorganic particle 2 include an amorphous shape, a spherical shape, a flaky shape, a needle shape, and the like. Among them, in terms of light diffusion effect, a spherical shape is preferable. In terms of total reflection effect, the flaky shape is preferable.

The light-reflective conductive particle 10 of FIG. 1A can be produced by a well-known film deposition technique (a so-called mechano-fusion method) in which powders of large size and small size are brought in physically collision to form a film composed of particles with a small particle diameter on the surfaces of particles with a large particle diameter. In this case, the light-reflective inorganic particles 2 are fixed to the metal material on the surface of the core particle 1 so as to bite into the metal material. Further, since the inorganic particles are less likely to be fixed to each other by fusion, a monolayer of the inorganic particles constitutes the light reflecting layer 3. Therefore, in the case of FIG. 1A, the thickness of the light reflecting layer 3 may be equivalent to or slightly smaller than the particle diameter of the light-reflective inorganic particle 2.

The light-reflective conductive particle 20 of FIG. 1B will next be described. The light-reflective conductive particle 20 is different from the light-reflective conductive particle 10 of FIG. 1A in that a light reflecting layer 3 includes a thermoplastic resin 4 functioning as an adhesive, light-reflective inorganic particles 2 are fixed to each other by the thermoplastic resin 4, and the light-reflective inorganic particles 2 form multiple layers (for example, two or three layers). Since such a thermoplastic resin 4 is included, the mechanical strength of the light reflecting layer 3 enhances, and therefore exfoliation of the inorganic particles is less likely to occur.

The light-reflective conductive particle 20 of FIG. 1B can be produced by the mechano-fusion method. In this case, a fine-particle thermoplastic resin 4 may be used in addition to the light-reflective inorganic particles 2 and the core particle 1. When the light-reflective conductive particle 20 of FIG. 1B is produced by the mechano-fusion method, the light-reflective conductive particle 10 of FIG. 1A is simultaneously produced.

As the thermoplastic resin 4, a halogen-free thermoplastic resin can be preferably used for reduction of the load on the environment. For example, polyolefin such as polyethylene and polypropylene, polystyrene, acrylic resin, or the like can be preferably used.

Such a light-reflective conductive particle 20 can also be produced by the mechano-fusion method. If the particle diameter of the thermoplastic resin 4 applicable for the mechano-fusion method is too small, an effect as an adhesive becomes low, and if the particle diameter is too large, the resin is difficult to be adhered to the core particle 1. Therefore, the particle diameter is preferably 0.02 to 4 µm, and more preferably 0.1 to 1 µm. Further, if the amount added of the thermoplastic resin 4 is too small, the effect as an adhesive is low, and if the amount is too large, unintended particle aggregates are produced. Therefore, the amount added is preferably 0.2 to 500 parts by mass, based on 100 parts by mass of the core particle 1 and more preferably 4 to 25 parts by mass.

In the light-reflective conductive particles 10 and 20, if the coverage of the surface of the core particle 1 covered with the light reflecting layer 3 including the light-reflective inorganic particles 2 as a component is too low, there is a concern that a desired light reflectivity cannot be obtained. The coverage is 70% or greater, and preferably 80% or greater.

The coverage can be determined, for example, by arranging light-reflective conductive particles on an adhesive tape so as to form a single particle layer, capturing an image taken with a CCD camera as a plan image enlarged at a magnification of 100 into a personal computer, and calculating an average coverage on the basis of a predetermined binarization process (process of converting a gray image into a binary image) by an image processing software (coverage measurement A). The coverage can also be determined by enlarging 30 conductive particles which are arbitrarily selected by a scanning electron microscope (for example, at a magnification of 8000), drawing a state of each conductive particle covered with adhered insulating particles in a two-dimensional manner, and calculating the average coverage of the 30 particles (coverage measurement B). Furthermore, the coverage can also be determined by empirically determining that the coverage is equal to or more than the lowest coverage (coverage measurement C).

It should be noted that the color of a surface of a core particle having the surface of gold, nickel, or copper is brown. In contrast, as a qualitative and simplified criterion for empirically determining the coverage, a criterion in which a case where the core particle can be observed to be gray is considered to be a coverage of 70% or greater can be exemplified. This criterion is supported by the general finding in which the correlation between the reflectance of a coating film of a paint including a resin material and light-reflective inorganic particles and the coverage is very high.

Figure 1C:
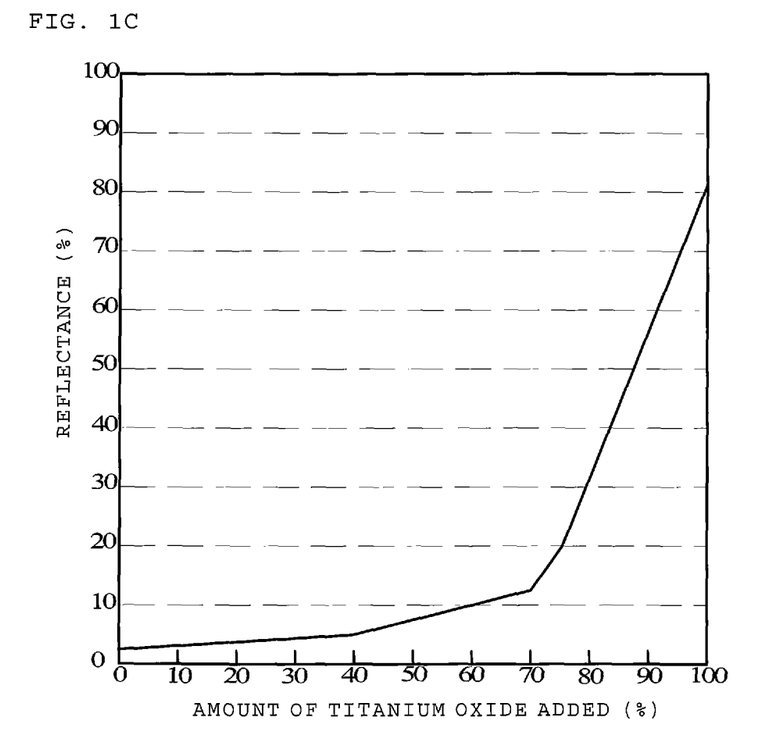
FIG. 1C is a diagram showing a relationship between the light reflectance and the mixed amount of titanium oxide.

For example, titanium oxide powders having an average particle diameter of 0.5 µm is homogeneously mixed in a thermosetting epoxy binder composition used in Example 1 of the present description in an amount such that the ratio of the titanium oxide powder to the total of the thermosetting epoxy binder composition and the titanium oxide powder is 0%, 40%, 50%, 60%, 70%, 80%, 90%, or 100%, as shown in FIG. 1C, to prepare a paint. The paint is applied to a black board so that the dried thickness is 100 µm, heated at 200° C. for one minute, and cured to obtain a cured product. The reflectance (JIS K7105) of light having a wavelength of 450 nm with respect of the resultant cured product is measured with a spectrophotometer (U3300, Hitachi, Ltd.) to obtain a reflectance curve shown in FIG. 1C. As observed from FIG. 1C, the ratio of the titanium oxide powder to the total of the thermosetting epoxy binder composition and the titanium oxide powder abruptly increases at 70%.

The anisotropic conductive adhesive of the present invention will next be described. The anisotropic conductive adhesive is obtained by dispersing the light-reflective conductive particles of the present invention in a thermosetting resin composition, and can be a paste, a film, or the like.

As a thermosetting resin composition used for the anisotropic conductive adhesive of the present invention, it is preferable that the used thermosetting resin composition be as colorless and transparent as possible. This is because the light reflective efficiency of the light-reflective conductive particles in the anisotropic conductive adhesive does not decrease, and the incident light is reflected without changing the color of the incident light. The colorless and transparent herein means that the cured product of the anisotropic conductive adhesive has a light transmittance (JIS K7105) of 80% or more with respect to visible light having a wavelength of 380 to 780 nm with a light path length of 1 cm, and preferably 90% or more.

In the anisotropic conductive adhesive of the present invention, if the amount added of the light-reflective conductive particles based on 100 parts by mass of the thermosetting resin composition is too small, conductive failure tends to occur, and if the amount is too large, a short circuit between traces tends to occur. Therefore, the amount added is preferably 1 to 100 parts by mass, and more preferably 10 to 50 parts by mass.

In order to improve light emission efficiency of the light-emitting element, the reflection property of the anisotropic conductive adhesive of the present invention is desirably configured such that the reflectance (JIS K 7105) of the cured product of the anisotropic conductive adhesive having a thickness of 100 μm with respect to light having a wavelength of 450 nm be at least 15%. In order to obtain such a reflectance, the reflection property and the amount added of the used light-reflective conductive particle, the mixed composition of the thermosetting resin composition, and the like may be appropriately adjusted. In general, increase of the amount added of the light-reflective conductive particles having a favorable reflection property tends to increase the reflectance.

From the viewpoint of refractive index (JIS K7142), the reflection property of the anisotropic conductive adhesive can be evaluated. This is because a too large difference of refractive index between the thermosetting resin composition of the anisotropic conductive adhesive and the light-reflective conductive particle increases a light refractive amount on an interface between the light-reflective conductive particle and the cured product of the thermosetting resin composition surrounding the particle. Specifically, it is desirable that the difference of refractive index between the thermosetting resin composition and the light-reflective inorganic particle is 0.02 or greater, and preferably 0.3 or greater. Further, the reflective index of the thermosetting resin composition containing an epoxy resin as a main component is generally about 1.5.

As the thermosetting resin composition constituting the anisotropic conductive adhesive of the present invention, materials used in the conventional anisotropic conductive adhesive and anisotropic conductive film can be used. In general, such a thermosetting resin composition is obtained by mixing a curing agent to an insulating binder resin. Preferable examples of the insulating binder resin include epoxy resins containing an alicyclic epoxy resin, a heterocyclic epoxy compound, or a hydrogenated epoxy resin as a main component.

Preferable examples of the alicyclic epoxy compound include compounds having two or more epoxy groups in their molecules. These may be liquid or solid. Specific examples thereof include glycidyl hexahydrobisphenol A, 3,4-epoxy-cyclohexenylmethyl-3',4'-epoxycyclohexene carboxylate, and the like. Among these, it is preferable that glycidyl hexahydrobisphenol A and 3,4-epoxycyclohexenylmethyl-3',4'-epoxycyclohexene carboxylate be used in terms that the cured product can ensure the light transmittance suitable for mounting an LED element and rapid curing properties are excellent.

Examples of the heterocyclic epoxy compound include epoxy compounds having a triazine ring. In particular, 1,3,5-tris(2,3-epoxypropyl)-1,3,5-triazine-2,4,6-(1H,3H,5H)-trione is preferable.

As the hydrogenated epoxy compound, hydrogenated compounds of the above alicyclic epoxy compound or heterocyclic epoxy compound, or other known hydrogenated epoxy resins can be used.

In the present invention, the alicyclic epoxy compound, the heterocyclic epoxy compound, and the hydrogenated epoxy compound may be used alone, or two or more kinds thereof may be used in combination. Any other epoxy compound may be used in combination with these epoxy compounds as long as the effect of the present invention is impaired. Examples thereof include glycidyl ethers obtained by reacting epichlorohydrin with a polyhydric phenol such as bisphenol A, bisphenol F, bisphenol S, tetramethylbisphenol A, diarylbisphenol A, hydroquinone, catechol, resorcin, cresol, tetrabromobisphenol A, trihydroxybiphenyl, benzophenone, bisresorcinol, bisphenol hexafluoroacetone, tetramethylbisphenol A, tetramethylbisphenol F, tris(hydroxyphenyl)methane, bixylenol, phenol-novolac, and cresol novolac; polyglycidyl ethers obtained by reacting epichlorohydrin with an aliphatic polyhydric alcohol such as glycerol, neopentyl glycol, ethylene glycol, propylene glycol, butylene glycol, hexylene glycol, polyethylene glycol, and polypropylene glycol; glycidyl ether esters obtained by reacting epichlorohydrin with a hydroxycarboxylic acid such as p-oxybenzoic acid and β-oxynaphthoic acid; polyglycidyl esters obtained from polycarboxylic acids such as phthalic acid, methylphthalic acid, isophthalic acid, terephthalic acid, tetrahydrophthalic acid, endomethylene tetrahydrophthalic acid, endomethylene hexahydrophthalic acid, trimellitic acid, and polymerized fatty acids; glycidylaminoglycidyl ethers obtained from aminophenol and aminoalkylphenol; glycidylaminoglycidyl esters obtained from aminobenzoic acid; glycidylamines obtained from aniline, toluidine, tribromoaniline, xylylenediamine, diamino cyclohexane, bisaminomethylcyclohexane, 4,4'-diaminodiphenyl methane, 4,4'-diaminodiphenyl sulfone, and the like; and known epoxy resins such as epoxidized polyolefin.

As the curing agent, an acid anhydride, an imidazole compound, dicyan, and the like can be used. Among them, an acid anhydride which is difficult to change the color of the cured product, and particularly an alicyclic acid anhydride curing agent can be preferably used. Specifically, methylhexahydrophthalic anhydride (MeHHPA), and the like can preferably be used.

In the case where an alicyclic epoxy compound and an alicyclic acid anhydride curing agent are used in the thermosetting resin composition of the anisotropic conductive adhesive of the present invention, if the used amount of the alicyclic acid anhydride curing agent is too small, the amount of an uncured epoxy compound tends to be large, resulting in poor curing. If the used amount is too large, corrosion of a material to be adhered tends to be promoted by the effects of excess curing agent. Therefore, it is preferable that the alicyclic acid anhydride curing agent be used in a ratio of 80 to 120 parts by mass based on 100 parts by mass of the alicyclic epoxy compound, and more preferably 95 to 105 parts by mass.

The anisotropic conductive adhesive of the present invention can be produced by homogeneously mixing the light-reflective conductive particles and the thermosetting resin composition. If the anisotropic conductive adhesive is used as an anisotropic conductive film, the particles and the resin composition are dispersed and mixed in a solvent such as toluene, and the resultant mixture is applied to a PET film subjected to a peel treatment so as to be a desired thickness, and dried at about 80° C.

Figure 2:
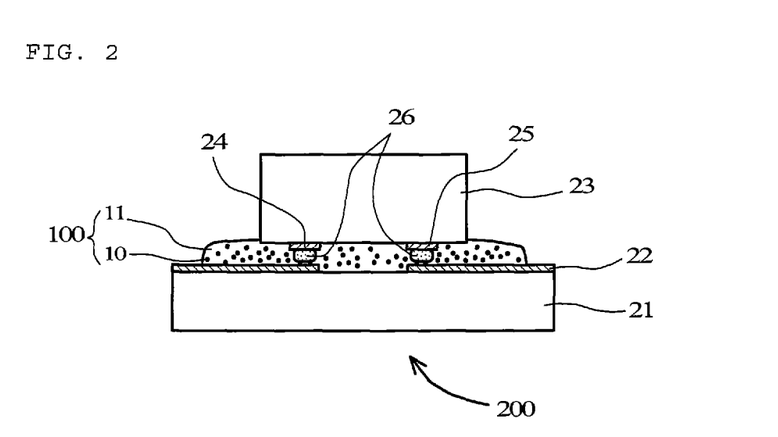
FIG. 2 is a cross-sectional view of a light-emitting device of the present invention.

The light-emitting device of the present invention will next be described with reference to FIG. 2. A light-emitting device 200 is a light-emitting device in which the above-described anisotropic conductive adhesive of the present invention is applied between connection terminals 22 on a substrate 21 and bumps 26 for connection which are respectively formed on an n electrode 24 and a p electrode 25 of an LED element 23 as a light-emitting element, and the substrate 21 and the LED element 23 are subjected to flip-chip mounting. A cured product 100 of the anisotropic conductive adhesive is obtained by dispersing light-reflective conductive particles 10 in the cured product 11 of the thermosetting resin composition. If necessary, the LED element 23 may be sealed with a transparent molding resin so as to cover the entire element 23.

In the light-emitting device 200 having such a configuration, among the light emitted by the LED element 23, light emitted toward the substrate 21 side is reflected by the light-reflective conductive particles 10 in the cured product 100 of the anisotropic conductive adhesive, and light is emitted from the upper surface of the LED element 23. Therefore, reduction of the light emission efficiency can be prevented.

EXAMPLES

Example 1

(Formation of Light-reflective Conductive Particle)

4 parts by mass of titanium oxide powder (KR-380, Titan kogyo, Ltd.) having an average particle diameter of 0.5 µm and 20 parts by mass of Au-covered resin conductive particles of which the appearance color was brown and the average particle diameter was 5 µm (particle in which a spherical acrylic resin particle having an average particle diameter of 4.6 µm was subjected to electroless gold plating so that the gold plating has a thickness of 0.2 µm: BRIGHT 20GNB4.6EH, Nippon Chemical Industrial Co., Ltd.) were added to a mechano-fusion device (AMS-GMP, Hosokawa Micron Corporation). A light reflecting layer which was formed of the titanium oxide particles and had a thickness of about 0.3 µm was formed on the surface of the conductive particles under conditions of a rotational speed of 1000 rpm and a rotational time of 20 minutes, to obtain a light-reflective conductive particle of Example 1. The appearance color of the light-reflective conductive particle was gray.

(Measurement of Coverage)

The coverage of the obtained light-reflective conductive particle covered with the light reflecting layer was measured in accordance with the coverage measurement B. The obtained results are shown in Table 1.

(Measurement of Light Reflectance)

15 parts by mass of the light-reflective conductive particles obtained and 100 parts by mass of a colorless and transparent thermosetting epoxy binder composition (YX-8000, Mitsubishi Chemical Corp.) having a refractive index of about 1.5 were homogeneously mixed using a vacuum defoaming mixer to obtain an anisotropic conductive adhesive of Example 1.

Figure 3:
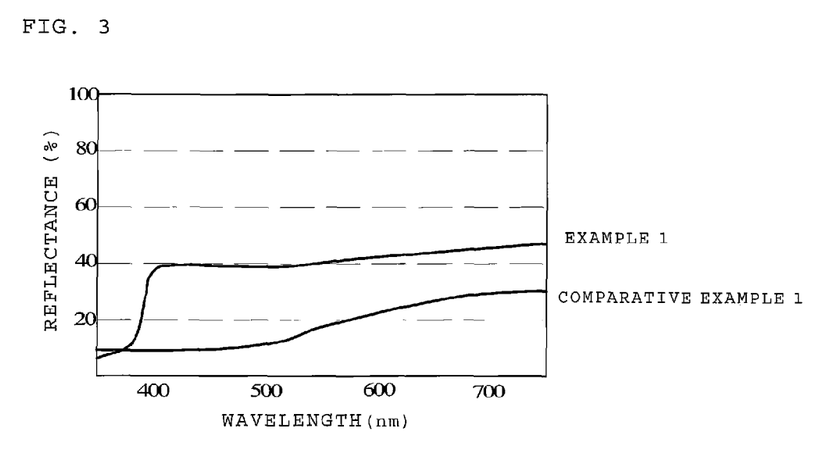
FIG. 3 is a diagram showing the light reflectance with respect to wavelengths of cured products of anisotropic conductive adhesives of Example 1 and Comparative Example 1.

The obtained anisotropic conductive adhesive was applied to a ceramic white plate so as to have a dried thickness of 100 µm, heated at 200° C. for one minute, and cured. The reflectance (JIS K 7105) of the cured product with respect to light having a wavelength of 450 nm was measured using a spectrophotometer (U3300, Hitachi, Ltd.). The obtained results are shown in Table 1 and FIG. 3.

(Electrical Properties (Conduction Reliability, Insulation Reliability) Evaluation Test)

A test IC chip (conductor connection area/conductor-space=1600 µm²/50 µmP) having a square of side 6 mm and a gold bump of height 15 µm was flip-chip mounted on a glass epoxy substrate having wirings, in which copper wirings having a pitch of 50 µm were Ni/Au plated (5.0 µm/0.3 µl in thickness), using the anisotropic conductive adhesive prepared during the light reflectance evaluation test under conditions of 200° C., 60 seconds, and 1 Kg/chip, thereby obtaining a test IC module.

1. Conduction Reliability

The test IC module was subjected to a temperature cycle test (TCT) (JIS C5030) of alternating between heating at a high temperature (100° C.) and cooling at a low temperature (−40° C.) to measure resistance values at an initial stage and after 500 cycles by the four probe method. When the resistance value was smaller than 1Ω, the conduction reliability was evaluated as good (A). When the resistance value was 1Ω or larger, the conduction reliability was evaluated as poor (C). The obtained results are shown in Table 1.

2. Insulation Reliability

A separately produced test IC module was subjected to the aging test under an environment of 85° C. and 85% RH over 1000 hours to measure the resistance values at an initial stage and after 1000 hours. When the resistance value was $10^6 \Omega$ or larger, the insulation reliability was evaluated as good (A). When the resistance value was smaller than $10^6 \Omega$, the insulation reliability was evaluated as poor (C). The obtained results are shown in Table 1.

Example 2

A light-reflective conductive particle of which the appearance color was gray was obtained in the same manner as in Example 1 except that the rotational speed of the mechano-fusion device (AMS-GMP, Hosokawa Micron Corporation) was changed from 1000 rpm to 700 rpm and the rotation time was changed from 20 minutes to 10 minutes, and further an anisotropic conductive adhesive was obtained. In the same manner as in Example 1, the coverage and the reflectance were measured, and the electrical properties (conduction reliability and insulation reliability) evaluation test was performed. The obtained results are shown in Table 1.

Example 3

A light-reflective conductive particle of which the appearance color was gray was obtained in the same manner as in Example 1 except that Ni-covered resin conductive particles (52NR-4.6EH, Nippon Chemical Industrial Co., Ltd.) having an average particle diameter of 5.0 µm were used instead of the Au-covered resin conductive particles, and further an anisotropic conductive adhesive was obtained. In the same manner as in Example 1, the coverage and the reflectance were measured, and the electrical properties (conduction reliability and insulation reliability) evaluation test was performed. The obtained results are shown in Table 1.

Example 4

4 parts by mass of titanium oxide powder (KR-380, Titan kogyo, Ltd.) having an average particle diameter of 0.5 µm, 3 parts by mass of polystyrene (PS) particles (GROSSDELL 2045, Mitsui Chemicals, Inc.) having an average particle diameter of 0.2 µm as an adhesive particle, and 20 parts by mass of conductive particles having an average particle diameter of 5 μm (particle in which a spherical acrylic resin particle having an average particle diameter of 4.6 μm was subjected to electroless gold plating so that the gold plating has a thickness of 0.2 μm: BRIGHT 20GNB4.6EH, Nippon Chemical Industrial Co., Ltd.) were added to a mechanofusion device (AMS-GMP, Hosokawa Micron Corporation). A light reflecting layer which was formed of the styrene and titanium oxide particles and had a thickness of about 1 μm was formed on the surface of the conductive particles under conditions of a rotational speed of 1000 rpm and a rotational time of 20 minutes, to obtain a light-reflective conductive particle of which the appearance color was gray. Further, an anisotropic conductive adhesive was obtained. In the same manner as in Example 1, the coverage and the reflectance were measured, and the electrical properties (conduction reliability and insulation reliability) evaluation test was performed. The obtained results are shown in Table 1.

Example 5

A light-reflective conductive particle of which the appearance color was gray was obtained in the same manner as in Example 4 except that Ni-covered resin conductive particles (52NR-4.6EH, Nippon Chemical Industrial Co., Ltd.) having an average particle diameter of 5.0 μm were used instead of the Au-covered resin conductive particles. Further, an anisotropic conductive adhesive was obtained. In the same manner as in Example 1, the coverage and the reflectance were measured, and the electrical properties (conduction reliability and insulation reliability) evaluation test was performed. The obtained results are shown in Table 1.

Example 6

A light-reflective conductive particle of which the appearance color was gray was obtained in the same manner as in Example 4 except that polyethylene (PE) particles (AMI-PEARL WF300, Mitsui Chemicals, Inc.) having an average particle diameter of 0.2 μm was used instead of the polystyrene particles (GROSSDELL 204S, Mitsui Chemicals, Inc.) having an average particle diameter is 0.2 μm. Further, an anisotropic conductive adhesive was obtained. In the same manner as in Example 1, the coverage and the reflectance were measured, and the electrical properties (conduction reliability and insulation reliability) evaluation test was performed. The obtained results are shown in Table 1.

Example 7

A light-reflective conductive particle of which the appearance color was gray was obtained in the same manner as in Example 4 except that a zinc oxide powder (one type of zinc oxide, Hakusuitech Ltd.) having an average particle diameter of 0.5 μm was used instead of the titanium oxide powder having an average particle diameter of 0.5 μm. Further, an anisotropic conductive adhesive was obtained. In the same manner as in Example 1, the coverage and the reflectance were measured, and the electrical properties (conduction reliability and insulation reliability) evaluation test was performed. The obtained results are shown in Table 1.

Example 8

A light-reflective conductive particle of which the appearance color was gray was obtained in the same manner as in Example 4 except that an aluminum oxide powder (AE-2500SI, Admatechs Company Limited) having an average particle diameter of 0.5 μm was used instead of the titanium oxide powder having an average particle diameter of 0.5 μm. Further, an anisotropic conductive adhesive was obtained. In the same manner as in Example 1, the coverage and the reflectance were measured, and the electrical properties (conduction reliability and insulation reliability) evaluation test was performed. The obtained results are shown in Table 1.

Example 9

A light-reflective conductive particle of which the appearance color was gray was obtained in the same manner as in Example 4 except that magnesium carbonate having an average particle diameter of 0.5 μm was used instead of the titanium oxide powder having an average particle diameter of 0.5 μm. Further, an anisotropic conductive adhesive was obtained. In the same manner as in Example 1, the coverage and the reflectance were measured, and the electrical properties (conduction reliability and insulation reliability) evaluation test was performed. The obtained results are shown in Table 1.

Example 10

A light-reflective conductive particle of which the appearance color was gray was obtained in the same manner as in Example 4 except that a titanium oxide powder (JR405, Tayca Corporation) having an average particle diameter of 0.2 μm was used instead of the titanium oxide powder having an average particle diameter of 0.5 μm. Further, an anisotropic conductive adhesive was obtained. In the same manner as in Example 1, the coverage and the reflectance were measured, and the electrical properties (conduction reliability and insulation reliability) evaluation test was performed. The obtained results are shown in Table 1.

Comparative Example 1

Au-covered resin conductive particles of which the appearance color was brown (particle in which a spherical acrylic resin particle having an average particle diameter of 4.6 μm was subjected to electroless gold plating so that the gold plating has a thickness of 0.2 μm: BRIGHT 20GNB4.6EH, Nippon Chemical Industrial Co., Ltd.) were used and the same procedure as in Example 1 was performed to obtain an anisotropic conductive adhesive. In the same manner as in Example 1, the reflectance was measured, and the electrical properties (conduction reliability and insulation reliability) evaluation test was performed. The obtained results are shown in Table 1.

Comparative Example 2

An anisotropic conductive adhesive was obtained in the same manner as in Comparative Example 1 except that Ni-covered resin conductive particles (52NR-4.6EH, Nippon Chemical Industrial Co., Ltd.) of which the appearance color was brown and the average particle diameter was 5.0 μm were used instead of the Au-covered resin conductive particles. In the same manner as in Example 1, the reflectance was measured, and the electrical properties (conduction reliability and insulation reliability) evaluation test was performed. The obtained results are shown in Table 1.

Comparative Example 3

3 parts by mass of polystyrene-based particles (GROSSDELL 204S, Mitsui Chemicals, Inc.) having an average particle diameter of 0.2 μm and 20 parts by mass of conductive particles having an average particle diameter of 5 μm (particle in which a spherical acrylic resin particle having an average particle diameter of 4.6 μm was subjected to electroless gold plating so that the gold plating has a thickness of 0.2 μm: BRIGHT 20GNB4.6EH, Nippon Chemical Industrial Co., Ltd.) were added to the mechano-fusion device (AMS-GMP, Hosokawa Micron Corporation). A styrene layer having a thickness of 0.2 μm was formed on the surface of the conductive particles under conditions of a rotational speed of 1000 rpm and a rotational time of 20 minutes. Resin-covered conductive particles of which the appearance color was brown were thereby obtained. Further, an anisotropic conductive adhesive was obtained. In the same manner as in Example 1, the reflectance was measured, and the electrical properties (conduction reliability and insulation reliability) evaluation test was performed. The obtained results are shown in Table 1.

Comparative Example 4

A conductive particle of which the appearance color was brown was obtained in the same manner as in Example 4 except that silicon oxide (silica) powder (SEAHOSTAR KEP-30, NIPPON SHOKUBAI CO., LTD.) having a refractive index of 1.45 and an average particle diameter of 0.5 μm was used instead of the titanium oxide powder having an average particle diameter of 0.5 μm. Further, an anisotropic conductive adhesive was obtained. In the same manner as in Example 1, the coverage and the reflectance were measured, and the electrical properties (conduction reliability and insulation reliability) evaluation test was performed. The obtained results are shown in Table 1.

As seen from Table 1, in the anisotropic conductive adhesives using the light-reflective conductive particles of Examples 1 to 10, the coverages of the light reflecting layer are 70% or greater, the light reflectances are all 15% or greater, and blue light having a wavelength of 450 nm was reflected with the original color being maintained. The conduction reliabilities and the insulation reliabilities thereof are also favorable.

On the other hand, in Comparative Examples 1 to 3, since the light reflecting layer is not provided on the surfaces of the conductive particles, the light reflectance is smaller than 10%. In Comparative Examples 1 and 2, short circuit was caused at the initial stage. In Comparative Example 3, short circuit was caused after the aging. Therefore, there is a problem of insulation reliability. In Comparative Example 4, the coverage of the light reflecting layer is 70% or greater. However, since silicon oxide having a refractive index smaller than 1.52 is used as an inorganic particle, the color of the conductive particles after formation of an inorganic particle layer is brown, and the light reflectance is about 10%. This may be because the difference of refractive index between the silicon oxide and the binder composition of the anisotropic conductive adhesive is smaller than 0.02.

Industrial Applicability

In the light-reflective conductive particle of the present invention, while a light reflecting layer which increases the production cost during the production of a light-emitting device by flip-chip mounting light-emitting elements such as a light-emitting diode (LED) element on a wiring board using an anisotropic conductive adhesive is not provided on the light-emitting element, the light emission efficiency is not reduced, and a hue difference between the emission color of

TABLE 1

| | | Example | | | | | | | | | | Comparative Example | | | |
|---|---|---|---|---|---|---|---|---|---|---|---|---|---|---|---|
| | | 1 | 2 | 3 | 4 | 5 | 6 | 7 | 8 | 9 | 10 | 1 | 2 | 3 | 4 |
| Raw material conductive particle | Surface metal | Au | Au | Ni | Au | Ni | Au | Au | Au | Au | Au | Au | Ni | Au | Au |
| | Particle diameter (μm) | 5.0 | 5.0 | 5.0 | 5.0 | 5.0 | 5.0 | 5.0 | 5.0 | 5.0 | 5.0 | 5.0 | 5.0 | 5.0 | 5.0 |
| Adhesive particle | Type | — | — | — | PS | PS | PE | PS | PS | PS | PS | — | — | PS | PS |
| | Particle diameter (μm) | — | — | — | 0.2 | 0.2 | 0.1 | 0.2 | 0.2 | 0.2 | 0.2 | — | — | 0.2 | 0.2 |
| Inorganic particle | Type | TiO$_2$ | TiO$_2$ | TiO$_2$ | TiO$_2$ | TiO$_2$ | TiO$_2$ | ZnO | Al$_2$O$_3$ | MgCO$_3$ | TiO$_2$ | — | — | — | SiO$_2$ |
| | Particle diameter (μm) | 0.5 | 0.5 | 0.5 | 0.5 | 0.5 | 0.5 | 0.5 | 0.5 | 0.5 | 0.2 | — | — | — | 0.5 |
| | Refractive index n1 | 2.71 | 2.71 | 2.71 | 2.71 | 2.71 | 2.71 | 1.95 | 1.76 | 1.52 | 2.71 | — | — | — | 1.45 |
| Light-reflective conductive particle | Color | Gray | Gray | Gray | Gray | Gray | Gray | Gray | Gray | Gray | Gray | Brown | Black | Brown | Brown |
| | Coverage (%) | >90 | 75 | >90 | >90 | >90 | >90 | >90 | >90 | >90 | >90 | — | — | — | >90 |
| | Reflectance (%) | 30 | 20 | 32 | 30 | 32 | 30 | 22 | 17 | 15 | 30 | 8 | 9 | 8 | 9 |
| Conduction reliability | Initial stage | A | A | A | A | A | A | A | A | A | A | A | A | A | A |
| | After TCT | A | A | A | A | A | A | A | A | A | A | A | A | A | A |
| Insulation reliability | Initial stage | A | A | A | A | A | A | A | A | A | A | C | C | A | A |
| | After aging | A | A | A | A | A | A | A | A | A | A | C | C | C | A | the light-emitting element and the reflected light color cannot be caused. Therefore, the anisotropic conductive adhesive of the present invention is useful for flip-chip mounting of LED elements.

REFERENCE SIGNS LIST 1 core particle
2 light-reflective inorganic particle
3 light reflecting layer
4 thermoplastic resin
10, 20 light-reflective conductive particle
11 cured product of thermosetting resin composition
21 substrate
22 connection terminal
23 LED element
24 n electrode
25 p electrode
26 bump
100 cured product of anisotropic conductive adhesive
200 light-emitting device

The invention claimed is:

1. A light-reflective conductive particle for an anisotropic conductive adhesive used for connecting a light-emitting element to a wiring board by anisotropic conductive connection, wherein the light-reflective conductive particle comprises a core particle covered with a metal material and a light reflecting layer formed of a light-reflective inorganic particle having a refractive index of 1.52 or greater on a surface of the core particle, and a coverage of the surface of the core particle covered with the light reflecting layer is 70% or greater.

2. The light-reflective conductive particle according to claim 1, wherein the metal material with which the core particle is covered is gold, nickel or copper.

3. The light-reflective conductive particle according to claim 1, wherein the core particle itself is a gold, nickel or copper particle.

4. The light-reflective conductive particle according to claim 1, wherein the core particle is a particle formed from a resin particle covered with gold, nickel or copper.

5. The light-reflective conductive particle according to claim 1, wherein the core particle has a particle diameter of 1 to 20 μm, and the light reflecting layer has a thickness of 0.5 to 50% of the particle diameter of the core particle.

6. The light-reflective conductive particle according to claim 1, wherein the light-reflective inorganic particle is at least one type selected from a titanium oxide particle, a zinc oxide particle, and an aluminum oxide particle.

7. The light-reflective conductive particle according to claim 1, wherein the light reflecting layer includes a thermoplastic resin.

8. The light-reflective conductive particle according to claim 7, wherein the thermoplastic resin is a polyolefin.

9. An anisotropic conductive adhesive used for connecting a light-emitting element to a wiring board by anisotropic conductive connection, the anisotropic conductive adhesive being obtained by dispersing the light-reflective conductive particle according to claim 1 in a thermosetting resin composition which provides a cured product having a light transmittance (JIS K7105) of 80% or greater with respect to visible light having a wavelength of 380 to 750 nm with a light path length of 1 cm.

10. The anisotropic conductive adhesive according to claim 9, wherein the light-reflective conductive particle is added in an amount of 1 to 100 parts by mass based on 100 parts by mass of the thermosetting resin composition.

11. The anisotropic conductive adhesive according to claim 9, wherein the cured product of the anisotropic conductive adhesive having a thickness of 100 μm has a reflectance (JIS K7105) of at least 15% with respect to light having a wavelength of 450 nm.

12. The anisotropic conductive adhesive according to claim 9, wherein a difference of refractive index between the thermosetting resin composition and the light-reflective conductive particle is 0.02 or greater.

13. The anisotropic conductive adhesive according to claim 9, wherein the thermosetting resin composition includes an epoxy resin and an acid anhydride-based curing agent.

14. A light-emitting device in which a light-emitting element is mounted on a wiring board with the anisotropic conductive adhesive according to claim 9 interposed therebetween in a flip-chip mounting scheme.

15. The light-emitting device according to claim 14, wherein the light-emitting element is a light-emitting diode.

* * * * *